United States Patent [19]

Allen et al.

[11] Patent Number: 5,291,071

[45] Date of Patent: Mar. 1, 1994

[54] HIGH SPEED, LOW POWER OUTPUT CIRCUIT WITH TEMPERATURE COMPENSATED NOISE CONTROL

[75] Inventors: Michael J. Allen, Rescue; Terry L. Baucom, Folsom, both of Calif.

[73] Assignee: Intel Corporation, Santa Clara, Calif.

[21] Appl. No.: 881,843

[22] Filed: May 12, 1992

Related U.S. Application Data

[63] Continuation-in-part of Ser. No. 752,780, Aug. 30, 1991, Pat. No. 5,168,178.

[51] Int. Cl.$^5$ ............................ H03K 3/01; H03K 3/26
[52] U.S. Cl. ..................................... 307/270; 307/310; 307/443
[58] Field of Search ............. 307/443, 263, 310, 296.5, 307/270

[56] References Cited

U.S. PATENT DOCUMENTS

| | | | |
|---|---|---|---|
| 4,894,561 | 1/1990 | Nogami | 307/310 |
| 4,975,598 | 12/1990 | Borkar | 307/310 |
| 4,975,599 | 12/1990 | Petrovick | 307/310 |

*Primary Examiner*—Edward P. Westin
*Assistant Examiner*—Andrew Sanders
*Attorney, Agent, or Firm*—Blakely Sokoloff, Taylor & Zafman

[57] ABSTRACT

The present invention discloses a semiconductor output circuit with temperature compensated noise control. The output circuit of the present invention presents an increase in speed, a reduction in power consumption, and a reduction in noise level as compared with the prior art temperature compensated noise control output circuits. These advantages are obtained by utilizing the present invention's current control means which current control means is driven by a temperature compensation circuit.

18 Claims, 4 Drawing Sheets

HIGH SPEED, LOW POWER OUTPUT CIRCUIT WITH TEMPERATURE COMPENSATED NOISE CONTROL

The present application is a Continuation-In-Part of copending application Ser. No. 07/752,780, now U.S. Pat. No. 5,168,178 entitled "High Speed NOR'ing, Inverting, MUX'ing, and Latching Circuit with Temperature Compensated Output Noise Control," Allen et al, filed Aug. 30, 1991, and assigned to the assignee of the present invention.

BACKGROUND OF THE INVENTION

1. Field of the Present Invention

The present invention relates to the field of semiconductor circuits. More particularly, the present invention relates to high speed and low noise semiconductor output circuitry.

2. Description of the Prior Art

The circuit design of output circuitry is of particular importance for the desired functioning of semiconductor chips and systems. The semiconductor output circuitry should be designed such that it ca drive high capacitance loads at a high speed. Furthermore, the semiconductor output circuitry should not generate excessive "inductive noise" on the ground and the supply voltage lines, even when the output circuitry is driving a highly capacitive load. Moreover, the semiconductor output circuitry should maintain its high speed even at high temperatures, and further maintain its low noise characteristics even at low temperatures. Therefore, the design of semiconductor output circuitry is of critical importance to the proper functioning of a semiconductor chip or system.

FIG. 1 illustrates a recent version of a prior art semiconductor output circuit indicated generally by numeral 10. Referring to FIG. 1, output driver transistor 20 typically drives the output load capacitance 22. Gate 18 of output driver transistor 20 is driven by transistors 14 and 16. The voltage at gate 27 of transistor 16 is determined by internal calculations of the semiconductor chip. Similarly, node 19 is connected to an output driver transistor 30, which in turn drives the output node 21. Transistors 15 and 17 are responsible for driving output driver transistor 30. The inverse polarity of the data that is placed at gate 27 of transistor 16 is placed at gate 37 of transistor 17. A reference voltage Vref drives both transistors 14 and 15.

Now attention is turned to the operation of the typical prior art output circuit shown in FIG. 1. P-channel transistor 14 is responsible for both "pulling up" gate 18 of transistor 20 to the supply voltage and also for counterbalancing the effect of temperature variations on the speed and the noise level at the output node 21. To perform the "pulling up" function, the voltage at the gate 28 of transistor 14 is always kept low enough so that transistor 14 always remains in the conductive state. Therefore, transistor 14 always provides a conductive path from node 18 to the supply voltage. As such, gate 18 of the driver transistor 20 is pulled up to the supply voltage whenever the pull-down N-channel transistor 16 is in the non-conductive state.

As stated above, transistor 14 also performs the function of compensating for the effect Of temperature variations on the speed of, and the noise generated by, the prior art output circuit 10. This function is performed by varying the voltage at gate 28 of transistor 14 as a function of the variations in the ambient temperature. The variations in the voltage of gate 28 of transistor 14 in turn causes concomitant changes in the resistivity of transistor 14. More specifically, the voltage of gate 28 is typically increased in response to a decrease in the ambient temperature. This increase in the voltage of gate 28 causes a concomitant increase in the resistivity of P-channel transistor 14, thus reducing the current flow from transistor 14 to transistor 16 during transitions of gate 18 of transistor 20. As such, the otherwise usual effect of low temperatures, which is to increase the current flow in semiconductor circuitry, is counterbalanced by actually reducing the current flow in the output circuitry at low temperatures in the manner discussed above. Thus, the generation of excessive noise by the output circuitry 10 is hindered, in part, by controlling the resistivity of the P-channel transistor 14.

Likewise, the otherwise usual effect of a high ambient temperature, namely a decrease the current flow in semiconductor circuitry, is offset by increasing the current flow between transistors 16 and 14 at high ambient temperatures in a similar manner that was discussed above.

As discussed above briefly, transistor 16 of the typical prior art output circuit 10 performs a pull-down function. Thus, when gate 27 of transistor 16 is at a voltage higher than the threshold voltage of transistor 16, it will be placed in the conductive state. In this state, transistor 16 "pulls down" gate 18 of transistor 20. Of course, transistors 16 and 14 are sized such that when transistor 16 is in the Conductive state, the path that transistor 16 provides to the ground is less resistive than the path provided by transistor 14 to the supply voltage, thus allowing transistor 16 to pull down gate 18 of transistor 20 to the ground voltage.

Transistor 30, the counterpart to transistor 20, drives the output node 21 to the supply voltage (less the threshold voltage of the N-channel transistor 20). Transistor 30 is driven by transistors 15 and 17 in generally the same manner that transistor 20 was driven by transistors 14 and 16. Therefore, transistor 30 and its pre-driver 40 are essentially a duplicate of transistor 20 and its pre-driver 42. Thus, the detailed operation of transistor 30 and pre-driver 40 is not separately discussed.

The typical prior art output circuitry described above has some disadvantages that are overcome by the circuit of the present invention. For example, the speed, power consumption, and noise performance of the prior art circuit 10 are significantly improved by the circuit of the present invention as will be discussed in the "Detailed Description of the Present invention" section below.

BRIEF SUMMARY OF THE INVENTION

The present invention discloses a semiconductor Output circuit with temperature compensated noise control. The output circuit of the present invention presents an increase in speed, a reduction in power consumption, and a reduction in noise level as compared with the prior art temperature compensated noise control output circuits.

DETAILED DESCRIPTION OF THE INVENTION

Figure 2:
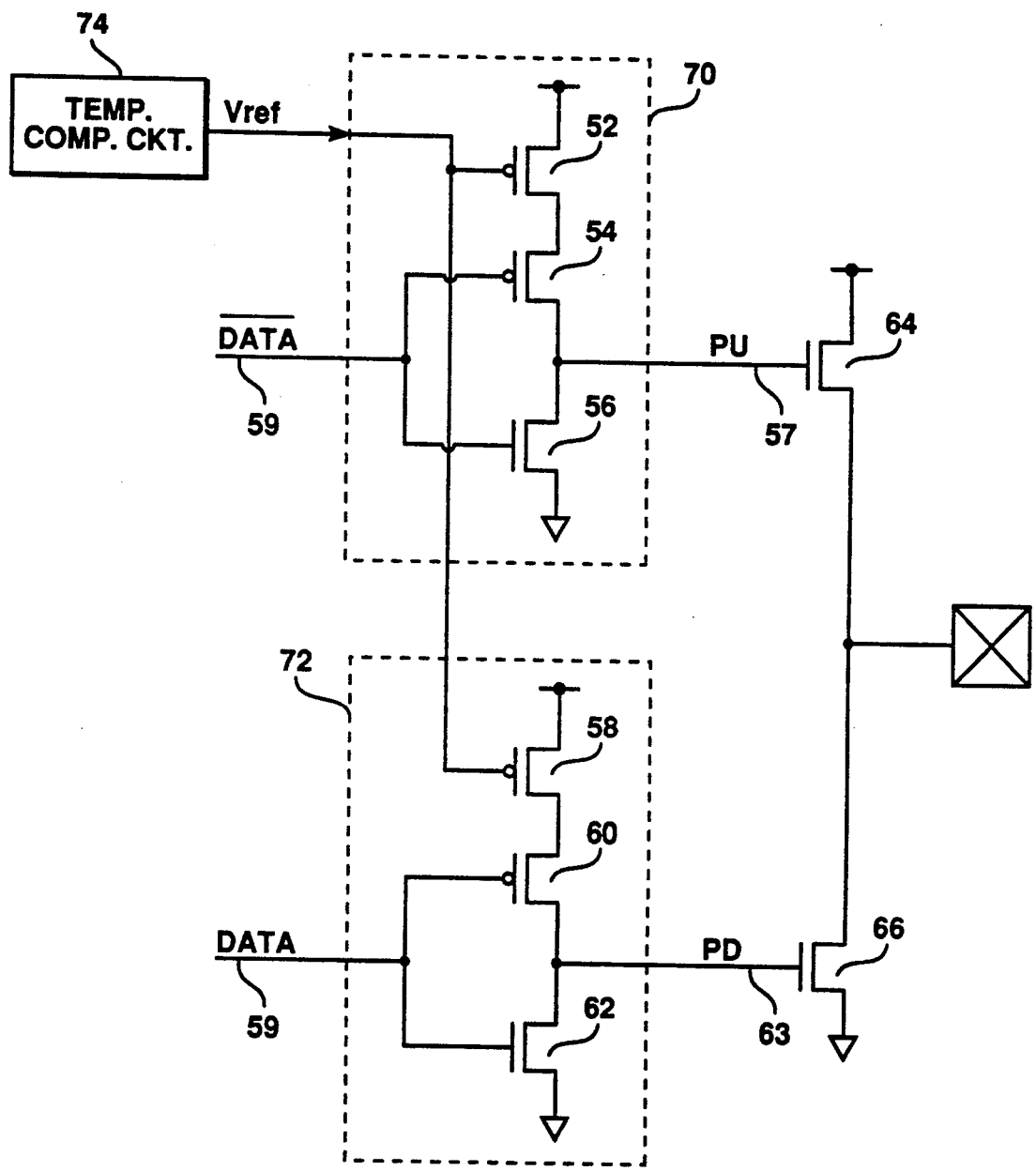
FIG. 2 illustrates the preferred embodiment of the output circuit of the present invention.

FIG. 2 shows the preferred embodiment of the present invention. The advances of the present invention, namely the speed, power consumption, and noise improvement are, in that order, explained by reference to FIG. 2.

First addressing the speed advantage of the present invention, reference is made to the "pre-driver" configuration referred to generally by numeral 72. Transistors 60 and 62 essentially comprise an inverter-like configuration in this pre-driver. Output 63 is inverted from input 59. The speed advantage of pre-driver 72 is best illustrated by a comparison with its counterpart combination of transistors 14 and 16 of the prior art pre-driver 42 shown in FIG. 1.

The primary speed advantage of pre-driver 72 of the present invention over pre-driver 42 of the prior art occurs when the two pre-drivers are pulling their respective outputs to the ground voltage. In the present invention, during the times when output 63 is being pulled to the ground voltage, the P-channel transistor 60 will be in the non-conducting state.

In this state, any potential current path from P-channel transistor 58 to N-channel transistor 62 is cut off. This potential current path exists because P-channel transistor 58 is driven by Vref, and is partially conducting. (The function of Vref will be discussed later in this document). Because of the fact that transistor 60 cuts off the potential current path between transistor 58 and transistor 62, output 63 will be driven to ground only by transistor 62, as opposed to being driven to opposite directions by both transistor 62 and transistor 58. This in turn causes a dramatic improvement in the speed of output 63.

In contrast, in the prior art pre-driver 42, transistor 14 which is driven by Vref and is partially conducting, would be always pulling output 18 up while transistor 16 would be pulling down on output 18. Because of the low resistivity of transistor 16, output 18 will eventually be pulled to ground. However, because P-channel transistor 14 is, in the meanwhile, pulling output node 18 to the supply voltage, the speed of output node 18 in its transition to ground is significantly less than the corresponding speed of output node 63 of the present invention. The same speed advantage that pre-driver 72 of the present invention has over pre-driver 42 of the prior art, is shown by pre-driver 70 of the present invention over its counterpart pre-driver 40 of the prior art.

Next, attention is turned to the power consumption advantage of the present invention. During any transition in output 63 of pre-driver 72, the potential conductive path between P-channel transistor 58 and ground is cut off by either N-channel transistor 62 or P-channel transistor 60. Thus, although transistor 58 is partially conductive, the path from the power supply to ground is cut off during transitions in output 63.

In contrast, in the prior art pre-driver 42 the potential conductive path between the power supply to ground is ever present. As such, during transitions in output 18 of pre-driver 42, some current would flow from the power supply to ground. This current flow results in a power consumption which has been eliminated by the present invention.

Furthermore, pre-driver 70 of the present invention represents the same power consumption advantage over the prior art pre-driver 40 as does pre-driver 72 over prior art pre-driver 42. It must be noted that the output circuitry of the present invention is repeated many times, often more than one hundred times, throughout the semiconductor chip. Thus, the reduction of power consumption per each individual output circuit of the present invention results in a large reduction in the aggregate power consumption of the semiconductor chip.

Separately, a second reason for power reduction in the present invention flows from the fact that the transitions to ground in the pre-driver outputs 63 and 57 are, as discussed above, quicker in the present invention than they are in the prior art pre-drivers 40 and 42. It is further noted that the gate of the output driver transistors 64 and 66 are always driven to opposite directions by their respective pre-driver outputs. For example, if output 57 of pre-driver 70 is pulling the gate of transistor 64 high, then output 63 of pre-driver 7 is pulling the gate of transistor 66 low.

Now, because the speed of the low-transitioning pre-driver output has been improved by the present invention, that pre-driver output pulls its respective output driver transistor's gate low before the high-transitioning pre-driver output can pull its respective output driver transistor's gate high. Therefore, the duration of time when both transistors 64 and 66 are in the conductive state is reduced compared to the prior art. This in turn means less current flow from the power supply to ground.

Figure 3A:
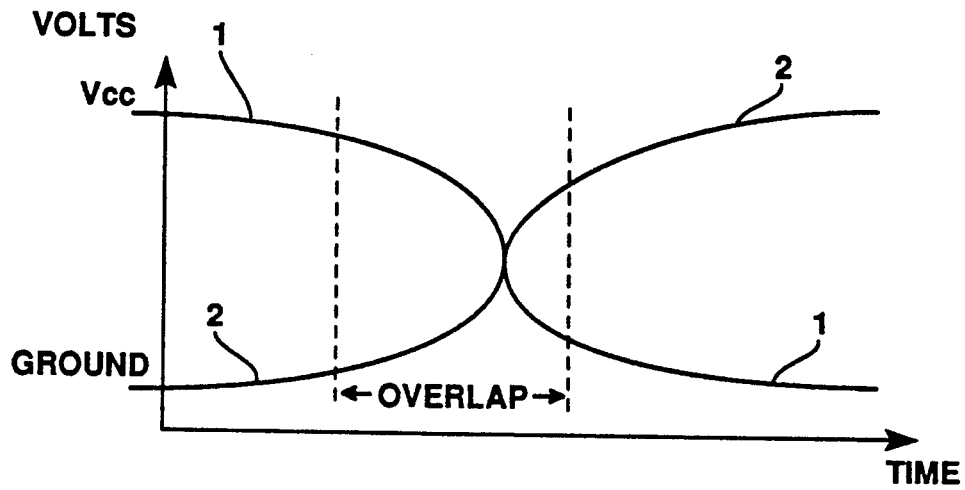
FIG. 3a depicts the time overlap during which the gates of both output driver transistors of the prior art are at a high voltage.

Since a large number of these output circuits are repeated throughout the semiconductor chip, the resulting reduction in power consumption is very significant. FIG. 3a shows the typical waveforms of the pre-driver outputs of the prior art. The waveform referred to by numeral 1 corresponds to the low-transitioning pre-driver output. The waveform referred to by numeral 2 corresponds to the high-transitioning pre-driver output. As shown in FIG. 3a, the output of the prior art pre-drivers are both high for a period of time during the transitions in the two pre-driver outputs. As discussed above, this overlap results in a conductive path from the power supply to ground and thus results in an undesirable power consumption.

Figure 3B:
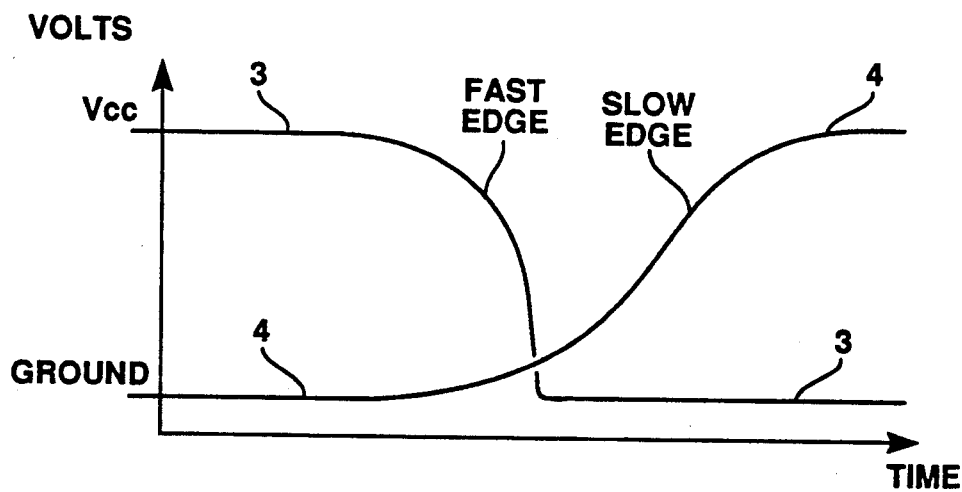
FIG. 3b depicts the voltage waveforms of the gates of output driver transistors of the present invention.

By contrast, as shown in FIG. 3b, the present invention has greatly reduced this overlap. Therefore, the conductive path from the power supply to ground is minimized during the transitions of the output drivers of the present invention. As discussed above, this results in a large reduction of the power consumption in the present invention.

The third advantage of the present invention over the prior art is that the noise level in the supply line and the ground line of the present invention is lower than the respective noise levels of the prior art. It is noted that the output circuitry in semiconductor chips is a major cause of undesirable noise. This is because of the large sizes of the transistors driving the output, the large size of the output capacitance and also that a large number of these output circuits are replicated throughout the semiconductor chip. All of these factors contribute to large transient currents in the ground and power supply lines. Because the supply and ground lines are long and thus have a significant inductance, this transient current induces large voltage fluctuations (i.e. noise) in the ground and supply lines. One way to reduce the size of these voltage fluctuations is to reduce the transient current flow in the supply and ground lines.

Because of the reduction in the pre-driver output overlap of the present invention that was discussed above, a corresponding reduction in the transient current flow in the the supply and ground lines takes place. This is so because a reduction in the time during which both output driver transistors 64 and 66 of FIG. 2 are conducting results in a reduction of current flow between the ground and supply lines. This in turn reduces the transient current in both the supply and ground lines. As explained above, the reduction of transient current results in a direct and significant reduction of noise in both the supply and ground lines.

Figure 1:
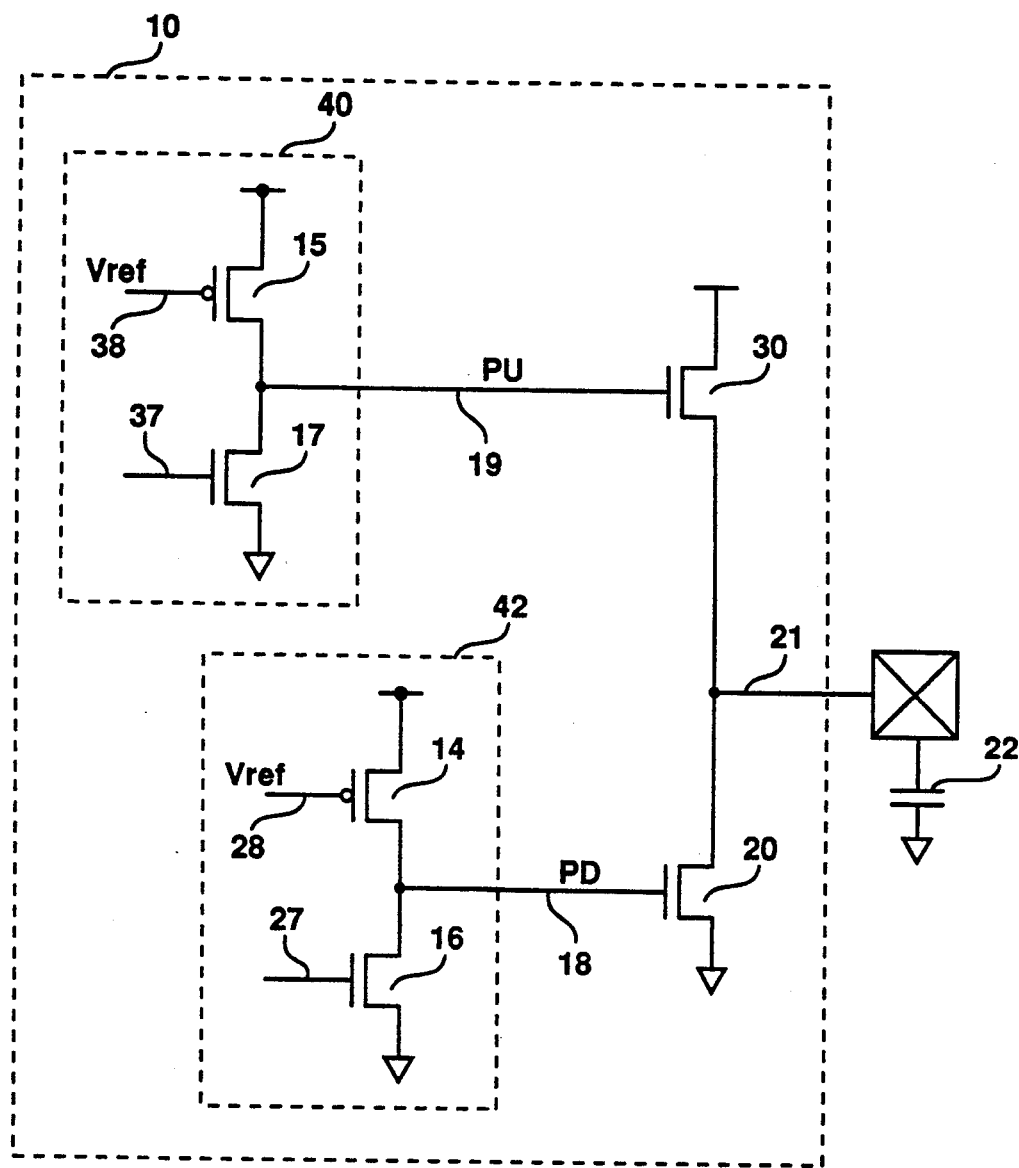
FIG. 1 shows the prior art temperature compensated noise control output circuit.
Figure 4:
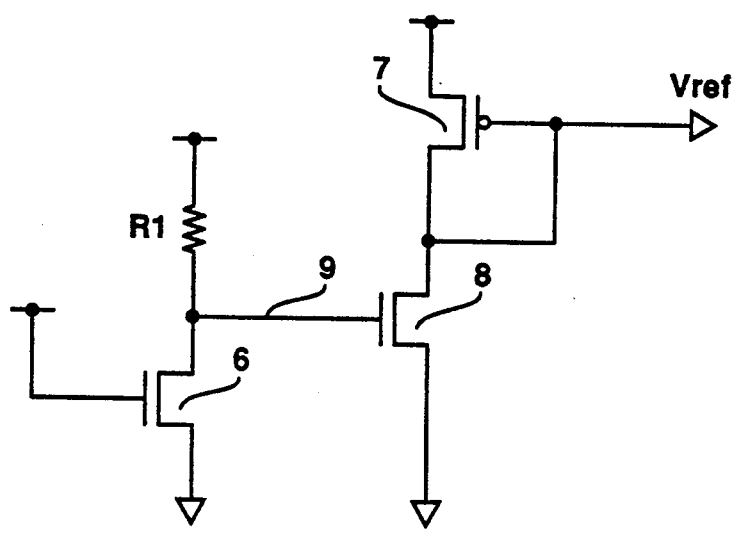
FIG. 4 shows a typical temperature compensation circuit used to generate a reference voltage for the output circuit of the present invention.

Thus far, the speed, power, and noise advantages of the present invention output circuit shown in FIG. 2 over the prior art output circuit of FIG. 1 were discussed. Now the means for generating Vref is briefly discussed to provide an understanding of the function Vref performs in the present invention. Referring to FIG. 4, the reference voltage generator of the present invention is shown. The current in resistor R1 and N-channel transistor 6 is determined by the total series resistance of these two elements. N-channel transistor 6 is always in the conductive mode, and its resistance is determined by its size. The voltage of node 9, feeding the gate of the N-channel transistor 8, is determined by the voltage divider relationship between resistor R1 and transistor 6. The voltage of node 9 drives transistor 8 and induces a current therein. This current is forced to flow through the P-channel transistor 7. This forced current then determines the gate to source voltage of transistor 7. Since the voltage of the source of transistor 7 is wired to the supply voltage, the gate voltage of transistor 7 changes in response to the current forced through that transistor while the source of transistor 7 remains at a constant voltage.

In response to the ambient temperature variations, the resistivity of resistor R1 changes more slowly than the resistivity of transistor 6 This differential is used to change the voltage of node 9 in response to temperature variations and thus to cause a change in the voltage Vref. More specifically, the resistivity of both resistor R1 and transistor 6 increases due to increasing ambient temperature. However, because the resistivity of resistor R1 increases less than that of transistor 7, the voltage of node 9 increases as the ambient temperature rises. This causes an increase in current in transistors 8 and thus an increase in current in transistor 7. This in turn induces a large gate to source voltage in transistor 7. Since the source voltage is constant, the gate voltage must decrease. Thus, as the ambient temperature rises the gate voltage of transistor 7 (i.e. Vref) decreases. With similar reasoning, as the ambient temperature falls the voltage of Vref increases.

It can therefore be seen that as the ambient temperature rises the gate voltages of the P-channel transistors 52 and 58 of FIG. 2 are reduced. This causes an increase in the current flow in each of the pre-drivers 70 and 72. This is the desired result, since the output circuitry as a whole would otherwise slow down in response to a rising ambient temperature. Therefore, this increase in current flow in pre-drivers 70 and 72 offsets the potential decrease in the speed in the output circuitry. Thus, the overall speed of the output circuitry is not reduced in response to the rising ambient temperature. Similarly, an increase in Vref results in an adjustment to the increased speed (and the increased undesirable power consumption) of the output circuitry when the ambient temperature has decreased.

Finally, while the output circuitry, including the pre-drivers of the present invention, have been disclosed and described with respect to preferred embodiments thereof, it will be understood that the circuits of present invention may be varied without departing from the spirit and scope thereof.

We claim:

1. A semiconductor circuit comprising:
   an output, a first transistor means for driving said output, a second transistor means for driving said first transistor means, a generator for generating a reference voltage electrically connected to said second transistor means, an input for receiving electrical signals and for driving said second transistor means;
   said first transistor means including a first driver transistor for driving said output to the supply voltage, and a second driver transistor for driving said output to ground;
   said transistor means including a first pre-driver circuit for driving said first driver transistor, and a second pre-driver circuit for driving said second driver transistor;
   said first pre-driver circuit including a first current control transistor and a first inverter, said first current control transistor being connected in series between said first inverter and the supply voltage;
   said input driving said first inverter;
   said reference voltage driving said first current control transistor so as to vary the resistivity of said first current control transistor in response to variations in said reference voltage, so as to cause said first current control transistor to vary the switching time of said first inverter in response to variations in said reference voltage;
   said second pre-driver circuit including a second current control transistor and a second inverter, said second current control transistor being connected in series between said second inverter and the supply voltage;
   said input driving said second inverter;
   said reference voltage driving said second current control transistor so as to vary the resistivity of said second current control transistor in response to variations in said reference voltage so as to cause said second current control transistor to vary the switching time of said second inverter in response to variations in said reference voltage;
   said generator generating said reference voltage by means of a temperature compensation circuit, said temperature compensation circuit causing said reference voltage to vary in response to variations of the ambient temperature;
   said temperature compensation circuit includes a reference current generation branch and a reference voltage generation branch;
   said reference current generation branch includes a resistor connecting the supply voltage and the drain of a first pull-down transistor, said first pull-down transistor having its source connected to ground, the gate of said first pull-down transistor being connected to a voltage above the threshold voltage of said first pull-down transistor, said reference voltage generation branch includes a second pull-down transistor, said gate of said second pull-down transistor being driven by said drain of said first pull-down transistor, said source of said pull-down transistor being connected to ground, said drain of said second pull-down transistor being connected to the drain of a pull-up transistor, the source of said pull-up transistor being connected to the supply voltage, the gate of said pull-up transistor being connected to said drain of said pull-up transistor;

said drain of said pull-up transistor generating said reference voltage; and said output varying in response to corresponding variations of said input, and said output switching time varying in response to variations in said switching time of said first and said second inverters of said first and second respective pre-drivers.

2. The semiconductor circuit of claim 1 wherein said first driver transistor of said first transistor means is an N-channel transistor.

3. The semiconductor circuit of claim 1 wherein said second driver transistor of said first transistor means is an N-channel transistor.

4. The semiconductor circuit of claim 1 wherein said first current control transistor of said first pre-driver circuit is a P-channel transistor.

5. The semiconductor circuit of claim 1 wherein said second current control transistor of said second pre-driver circuit is a P-channel transistor.

6. The semiconductor circuit of claim 1 wherein said reference voltage causes the resistivity of said first and said second current control transistors to vary in response to variations in said reference voltage so as to cause said switching times of said first and said second inverters to vary in response to variations in said reference voltage.

7. The semiconductor circuit of claim 6 wherein said reference voltage causes the switching times of said first inverter and said second inverters to decrease in response to an increase in said reference voltage, said reference voltage causes the switching times of said first and said second inverters to increase in response to a decrease in said reference voltage.

8. The semiconductor circuit of claim 1 wherein said temperature compensation circuit lowers said reference voltage in response to a rising ambient temperature, said temperature compensation circuit increases said reference voltage in response to a falling ambient temperature.

9. The semiconductor circuit of claim 1 wherein said semiconductor circuit is fabricated on a P-type silicon substrate.

10. A semiconductor circuit comprising:

an output, a first transistor means for driving said output, a second transistor means for driving said first transistor means, a reference voltage electrically connected to said second transistor means, a temperature compensation circuitry for generating said reference voltage, an input for receiving electrical signals and for driving said second transistor means;

said temperature compensation circuitry causing said reference voltage to vary in response to variations in the ambient temperature;

said temperature compensation circuit includes a reference current generation branch and a reference voltage generation branch;

said reference current generation branch includes a resistor connecting the supply voltage and the drain of a first pull-down transistor, said first pull-down transistor having its source connected to ground, the gate of said first pull-down transistor being connected to a voltage above the threshold voltage of said first pull-down transistor;

said reference voltage generation branch includes a second pull-down transistor, said gate of said second pull-down transistor being driven by said drain of said first pull-down transistor, said source of said pull-down transistor being connected to ground, said drain of said second pull-down transistor being connected to the drain of a pull-up transistor, the source of said pull-up transistor being connected to the supply voltage, the gate of said pull-up transistor being connected to said drain of said pull-up transistor;

said drain of said pull-up transistor generating said reference voltage;

said first transistor means including a first driver transistor for driving said output to the supply voltage, and a second driver transistor for driving said output to ground;

said second transistor means including a first pre-driver circuit for driving said first driver transistor, and a second pre-driver circuit for driving said second driver transistor;

said first pre-driver circuit including a first current control transistor and a first inverter, said first current control transistor being connected in series between said first inverter and the supply voltage;

said input driving said first inverter;

said reference voltage driving said first current control transistor so as to vary the resistivity of said first current control transistor in response to variations in the ambient temperature;

said first current control transistor causing the switching time of said first inverter to vary in response to variations in the ambient temperature;

said second pre-driver circuit includes a second current control transistor and a second inverter, said second current control transistor being connected in series between said second inverter and the supply voltage;

said input driving said second inverter;

said reference voltage driving said second current control transistor so as to vary the resistivity of said second current control transistor in response to variations in the ambient temperature;

said second current control transistor causing the switching time of said second inverter to vary in response to variations in the ambient temperature; and said output varying in response to corresponding variations of said input, and said output switching time varying in response to variations in said switching time of said first and said second inverters of said first and second respective pre-drivers.

11. The semiconductor circuit of claim 10 wherein said first driver transistor of said first transistor means is an N-channel transistor.

12. The semiconductor circuit of claim 10 wherein said second driver transistor of said first transistor means is an N-channel transistor.

13. The semiconductor circuit of claim 10 wherein said first current control transistor of said first pre-driver circuit is a P-channel transistor.

14. The semiconductor circuit of claim 10 wherein said second current control transistor of said second pre-driver circuit is a P-channel transistor.

15. The semiconductor circuit of claim 10 wherein said reference voltage causes the resistivity of said first and said second current control transistors to vary in response to variations in said reference voltage thereby causing said switching times of said first and said second inverters to vary in response to variations in said reference voltage.

16. The semiconductor circuit of claim 15 wherein said reference voltage causes the switching times of said first inverter and said second inverters to decrease in response to an increase in said reference voltage, said reference voltage further causes the switching times of said first and said second inverters to increase in response to a decrease in said reference voltage.

17. The semiconductor circuit of claim 10 wherein said temperature compensation circuit lowers said reference voltage in response to a rising ambient temperature, said temperature compensation circuit increases said reference voltage in response to a falling ambient temperature.

18. The semiconductor circuit of claim 10 wherein said semiconductor circuit is fabricated on a P-type silicon substrate.

* * * * *

UNITED STATES PATENT AND TRADEMARK OFFICE
CERTIFICATE OF CORRECTION

PATENT NO. : 5,291,071
DATED : March 1, 1994
INVENTOR(S) : Allen et al.

It is certified that error appears in the above-identified patent and that said Letters Patent is hereby corrected as shown below:

In column 1 at line 24 delete "ca" and insert --can--

Signed and Sealed this

Twenty-fifth Day of February, 1997

Attest:

BRUCE LEHMAN

*Attesting Officer*  *Commissioner of Patents and Trademarks*